US011527735B2

(12) United States Patent
Wang et al.

(10) Patent No.: US 11,527,735 B2
(45) Date of Patent: Dec. 13, 2022

(54) FLEXIBLE DISPLAY PANEL WITH CONNECTING PORTION AND FLEXIBLE BRIDGING PORTION, METHOD FOR MANUFACTURING THE SAME AND DISPLAY DEVICE

(71) Applicant: BOE Technology Group Co., Ltd., Beijing (CN)

(72) Inventors: Pinfan Wang, Beijing (CN); Fangxu Cao, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 35 days.

(21) Appl. No.: 16/862,225

(22) Filed: Apr. 29, 2020

(65) Prior Publication Data
US 2021/0050549 A1 Feb. 18, 2021

(30) Foreign Application Priority Data
Aug. 14, 2019 (CN) .......................... 201910750393.0

(51) Int. Cl.
*H01L 51/52* (2006.01)
*H01L 27/32* (2006.01)
*H01L 51/00* (2006.01)
*H01L 51/56* (2006.01)

(52) U.S. Cl.
CPC ...... *H01L 51/5237* (2013.01); *H01L 27/3258* (2013.01); *H01L 51/0097* (2013.01); *H01L 51/56* (2013.01); *H01L 2227/323* (2013.01); *H01L 2251/301* (2013.01); *H01L 2251/5338* (2013.01)

(58) Field of Classification Search
CPC ............. H01L 51/5237; H01L 27/3258; H01L 51/0097; H01L 51/56; H01L 2227/323; H01L 2251/301; H01L 2251/5338
USPC .......................................................... 257/40
See application file for complete search history.

(56) References Cited

U.S. PATENT DOCUMENTS

| 2011/0037059 A1* | 2/2011 | Gyoda .................. H01L 51/524 257/40 |
| 2019/0103448 A1* | 4/2019 | Cho ........................ H01L 51/56 |
| 2019/0207131 A1* | 7/2019 | Lu ........................ H01L 51/5253 |

(Continued)

*Primary Examiner* — Xia L Cross
(74) *Attorney, Agent, or Firm* — ArentFox Schiff LLP; Michael Fainberg (57) ABSTRACT

The disclosure discloses a flexible display panel, a method for manufacturing the same and a display device. The flexible display panel includes a plurality of display sub-regions arranged at intervals, a plurality of flexible bridging portions and a plurality of connecting portions; every two adjacent display sub-regions are electrically connected through at least one of the flexible bridging portions; and the every two adjacent display sub-regions are further connected through at least one of the connecting portions; where when the every two adjacent display sub-regions are stretched, the at least one of the connecting portions is broken preferentially and enables the every two adjacent display sub-regions to deform; and the at least one of the flexible bridging portions electrically connects the every two adjacent display sub-regions before the at least one of the connecting portions is broken and after the at least one of the connecting portions is broken.

14 Claims, 7 Drawing Sheets

(56) References Cited

U.S. PATENT DOCUMENTS

2019/0296099 A1* 9/2019 Lee .................... H01L 27/3246
2020/0212117 A1* 7/2020 Jeon .................... H01L 51/5237

* cited by examiner

FLEXIBLE DISPLAY PANEL WITH CONNECTING PORTION AND FLEXIBLE BRIDGING PORTION, METHOD FOR MANUFACTURING THE SAME AND DISPLAY DEVICE

The present application claims the priority from Chinese Patent Application No. 201910750393.0, filed with the Chinese Patent Office on Aug. 14, 2019, and entitled "FLEXIBLE DISPLAY PANEL AND DISPLAY DEVICE", which is hereby incorporated by reference in its entirety.

FIELD

The present disclosure relates to the technical field of display, in particular to a flexible display panel, a method for manufacturing the same and a display device.

BACKGROUND

In a flexible display panel, a plurality of device regions and bridge regions connected between the device regions generally need to be arranged in a stretchable region of the display panel, and support structures are connected between the bridge regions and the device regions. When the stretchable region in the display panel is stretched, the support structures are broken, so that the bridge regions are stretched. However, in practice, signal lines are arranged on the bridge regions, when the support structures are broken, the signal lines on the bridge regions are damaged when being stretched, and the damage risk of the signal line is increased.

SUMMARY

An embodiment of the present disclosure provides a flexible display panel, a method for manufacturing the same and a display device, and the flexible display panel includes: a plurality of display sub-regions arranged at intervals, a plurality of flexible bridging portions and a plurality of connecting portions;

every two adjacent display sub-regions among the plurality of display sub-regions are electrically connected through at least one of the flexible bridging portions; and the every two adjacent display sub-regions are further connected through at least one of the connecting portions;

where, the at least one of the connecting portions is configured for being broken preferentially and enabling the every two adjacent display sub-regions to deform when the every two adjacent display sub-regions are stretched; and the at least one of the flexible bridging portions is configured for electrically connecting the every two adjacent display sub-regions before the at least one of the connecting portions is broken and after the at least one of the connecting portions is broken.

Optionally, in the embodiment of the present disclosure, each of the plurality of display sub-regions includes a first flexible substrate, and each of the plurality of flexible bridging portions includes a second flexible substrate.

Optionally, in the embodiment of the present disclosure, the first flexible substrate and the second flexible substrate are a continuous flexible substrate.

Optionally, in the embodiment of the present disclosure, at least one of connecting portions is a first strip structure, at least one of the flexible bridging portions is a second strip structure, and a width of the first strip structure is smaller than a width of the second strip structure.

Optionally, in the embodiment of the present disclosure, each of the plurality of the connecting portions has a first size in a direction perpendicular to a surface of the continuous flexible substrate, the continuous flexible substrate has a second size in a direction perpendicular to the surface of the continuous flexible substrate, and the first size is smaller than the second size.

Optionally, in the embodiment of the present disclosure, the first size is smaller than 10 μm, and the second size is in a range of 5 μm~30 μm.

Optionally, in the embodiment of the present disclosure, each of the plurality of display sub-regions includes a buffer layer, an active layer, a gate insulating layer, an interlayer dielectric layer, source and drain electrode layers, an interlayer flat layer and a thin film encapsulation layer which are arranged on the first flexible substrate; and the thin film encapsulation layer includes a first inorganic encapsulation layer, an organic encapsulation layer and a second inorganic encapsulation layer.

Optionally, in the embodiment of the present disclosure, the plurality of the connecting portions are arranged on a same layer with a same material as at least one of the gate insulating layer, the interlayer dielectric layer, the buffer layer and the first inorganic encapsulation layer and the second inorganic encapsulation layer.

Optionally, in the embodiment of the present disclosure, the flexible display panel includes at least four display sub-regions;

in a horizontal direction, a flexible bridging portion between two adjacent display sub-regions of the at least four display sub-regions is arranged near a center of the at least four display sub-regions, and a connecting portion between the two adjacent display sub-regions of the at least four display sub-regions is arranged far away from the center of the at least four display sub-regions; and in a vertical direction, a flexible bridging portion between two adjacent display sub-regions of the at least four display sub-regions is arranged far away from the center of the at least four display sub-regions, and a connecting portion between the two adjacent display sub-regions of the at least four display sub-regions is arranged near the center of the at least four display sub-regions.

Optionally, in the embodiment of the present disclosure, at least one connecting portion includes a plurality of mutually independent connecting lines.

Optionally, in the embodiment of the present disclosure, each of the plurality of connecting portions includes a portion made of a brittle material, and the brittle material includes at least one of molybdenum or silicon oxide.

Optionally, in the embodiment of the present disclosure, in a direction perpendicular to a surface of the continuous flexible substrate, an orthographic projection of the portion made of the brittle material in the each of the plurality of connecting portions on the continuous flexible substrate is not overlapped with an orthographic projection of two adjacent display sub-regions corresponding to the each of the plurality of connecting portions on the flexible substrate.

Optionally, in the embodiment of the present disclosure, the flexible display panel further includes: a plurality of signal lines; the plurality of signal lines extend in an arrangement direction of the at least four display sub-regions and each is in the at least one of the flexible bridging portions between the every two adjacent display sub-regions; and the signal lines are used for inputting signals to a driving circuit.

Accordingly, the embodiments of the present disclosure further provide a display device provided by an embodiment of the present disclosure, where the display device includes the flexible display panel described above.

Accordingly, the embodiments of the present disclosure further provide a method for manufacturing the above flexible display panel, including:

forming a buffer layer on a flexible substrate;

forming an interlayer flat layer on the buffer layer;

forming the plurality of display sub-regions by fabricating light emitting elements on the interlayer flat layer in first regions; and forming the plurality of the connecting portions by removing the interlayer flat layer in second regions through exposure and development and by removing the flexible substrate in the second regions through an etching process;

where regions between the plurality of display sub-regions and the plurality of connecting portions correspond to the plurality of flexible bridging portions.

Optionally, in the embodiment of the present disclosure, the method further includes:

forming an opening region by removing the interlayer flat layer in a third region through exposure and development and by removing the buffer layer and the flexible substrate in the third region through the etching process.

Optionally, in the embodiment of the present disclosure, the method further includes: forming a first thin film encapsulation layer on a side, away from the flexible substrate, of the light emitting elements;

forming a second thin film encapsulation layer on a side, away from the flexible substrate, of the interlayer flat layer in the plurality of flexible bridging portions; and forming a third thin film encapsulation layer on a surface of the buffer layer which is uncovered in the connecting portion.

DETAILED DESCRIPTION OF THE EMBODIMENTS

In order to make the objectives, technical solutions and advantages of the embodiments of the present disclosure clearer, the technical solutions of the embodiments of the present disclosure will be clearly and completely described below with reference to the accompanying drawings of the embodiments of the present disclosure. Obviously, the described embodiments are a part of embodiments of the present disclosure, but not all the embodiments. In the case of no conflict, the embodiments of the present disclosure and the features in the embodiments can be combined with each other. Based on the described embodiments of the present disclosure, all other embodiments obtained by those of ordinary skill in the art without creative labor shall fall within the protection scope of the present disclosure.

Unless otherwise defined, the technical or scientific terms used in the present disclosure shall have the ordinary meanings understood by those of ordinary skill in the field to which the present disclosure belongs. The terms "first", "second" and the like used in the present disclosure do not indicate any order, quantity or importance, but are only used to distinguish different components. Words such as "comprising" or "including" mean that elements or items appearing before the words cover elements or items appearing after the words and the equivalents thereof without excluding other elements or items. Words such as "connection" or "linkage" are not limited to physical or mechanical connection, but may include electrical connection, whether direct or indirect.

It should be noted that the sizes and shapes of the figures in the drawings do not reflect the true scale, and are only used to illustrate the content of the present disclosure. The same or similar reference numerals indicate the same or similar elements or elements having the same or similar functions throughout.

Figure 1:
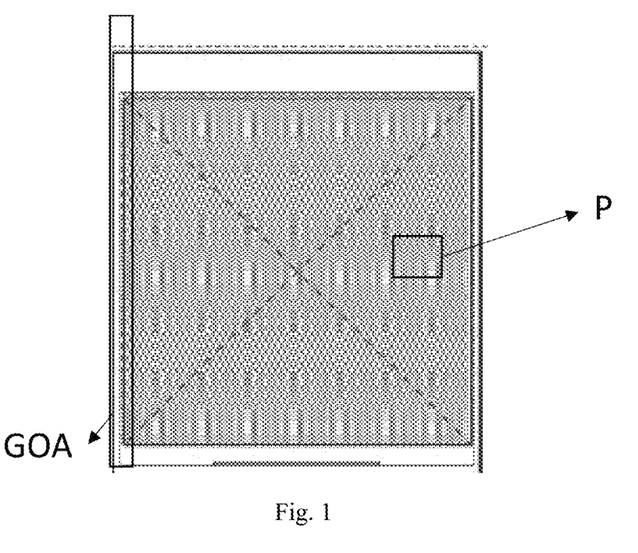
FIG. 1 is a schematic top view of a flexible display panel according to an embodiment of the present disclosure.

In view of this, referring to FIGS. 1 to 5, embodiments of the present disclosure provide a flexible display panel. Referring to FIG. 1, the flexible display panel includes a display region with light emitting pixels and a circuit wiring region GOA (Gate on Array) located on the peripheral region; and the area P in the display region is enlarged to obtain a schematic diagram. The flexible display panel includes: a flexible substrate 101 and a preset region 102; the preset region 102 includes: a plurality of display sub-regions 103 arranged at intervals, a plurality of flexible bridging portions 104 and a plurality of connecting portions 105; an opening 106 is formed between every two adjacent display sub-regions 103, and every two adjacent display sub-regions 103 among the plurality of display sub-regions are electrically connected through at least one flexible bridging portion 104; every two adjacent display sub-regions 103 are further connected through at least one connecting portion 105; where, when the plurality of display sub-regions 103 are stretched, the at least one connecting portion 105 is configured for being broken preferentially and enabling the plurality of display sub-regions 103 to deform; and the at least one flexible bridging portion 104 is configured for electrically connecting the every two adjacent display sub-regions 103 before the at least one connecting portion 105 is broken and after the at least one connecting portion 105 is broken. Where, in a direction L1 perpendicular to the extending direction L2 of the opening 106 and parallel to the surface of the flexible substrate 101, the size of the flexible bridging portion 104 is larger than that of the connecting portion 105.

According to the flexible display panel provided by the embodiments of the present disclosure, the flexible display panel includes a flexible substrate and a preset region; the preset region includes: a plurality of display sub-regions arranged at intervals, a plurality of flexible bridging portions and a plurality of connecting portions; an opening is formed between every two adjacent display sub-regions, and every two adjacent display sub-regions are connected through at least one flexible bridging portion; every two adjacent display sub-regions are further connected through at least one connecting portion; in a direction perpendicular to the extending direction of the openings and parallel to the surface of the flexible substrate, the size of the connecting portion is smaller than that of the flexible bridging portion; and the connecting portions are configured to enable the preset region on the flexible substrate to be stretched and to be deformed during breakage. Since the connecting portions and the flexible bridging portions which are connected between every two adjacent display sub-regions are independent of each other and are not connected with each other, and in the direction perpendicular to the extending direction of the openings and parallel to the surface of the flexible substrate, the size of the connecting portion is smaller than that of the flexible bridging portion, when the preset region of the flexible display panel is stretched, the connecting portions connected between every two adjacent display sub-regions are preferentially broken, and thus the preset region is deformed. Compared with the mode that a support structure is arranged between every two adjacent display sub-regions and the flexible display panel is deformed by controlling the support structures to break, in the present disclosure, by preferentially breaking the connecting portions, the preset region can be controlled to deform, and thus the breakage risk of the flexible bridging portions during stretching can be reduced.

Figure 2:
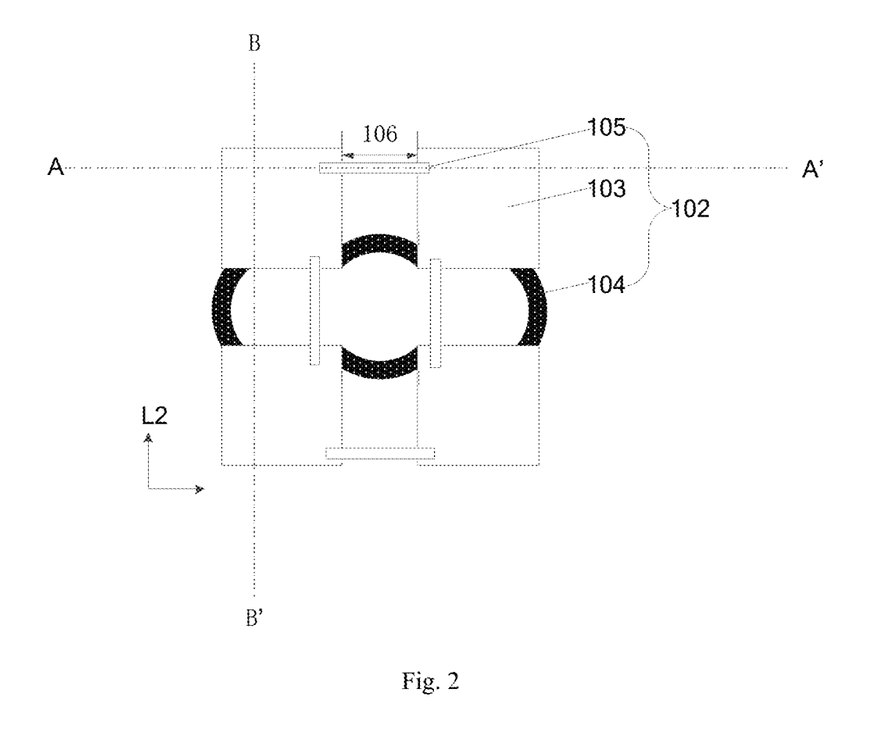
FIG. 2 is a schematic top view of an area P of the flexible display panel according to an embodiment of the present disclosure.
Figure 3:
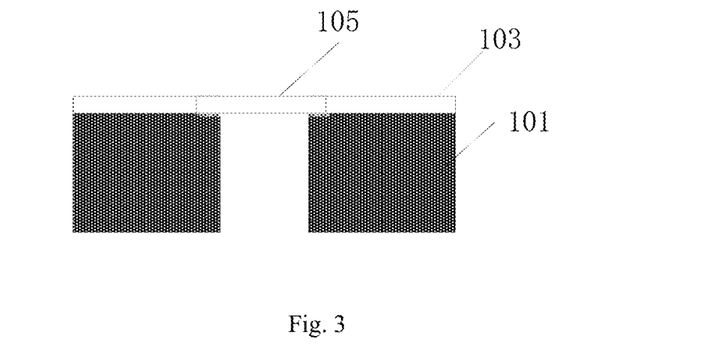
FIG. 3 is a schematic cross-sectional structure diagram of the flexible display panel shown in FIG. 2 in the AA' direction according to an embodiment of the present disclosure.
Figure 4:
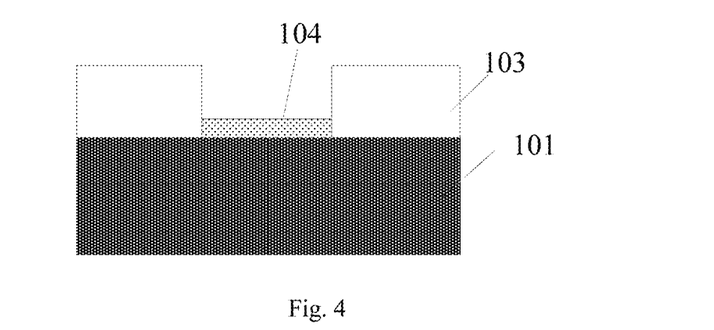
FIG. 4 is a schematic cross-sectional structure diagram of the flexible display panel shown in FIG. 2 in the BB' direction according to an embodiment of the present disclosure.
Figure 5:
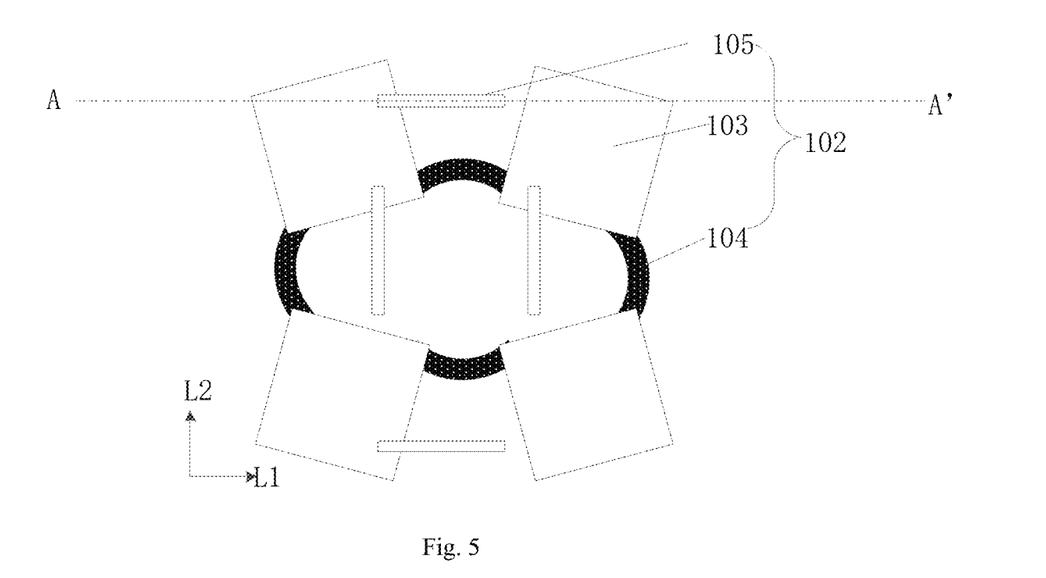
FIG. 5 is a schematic top view of a flexible display panel according to an embodiment of the present disclosure during stretching.
Figure 6:
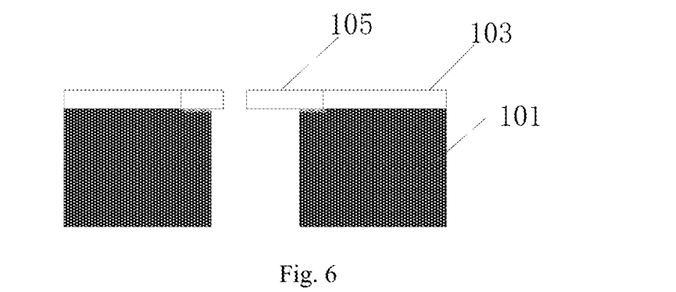
FIG. 6 is a schematic cross-sectional structure view of the flexible display panel shown in FIG. 5 in the AA' direction.

FIG. 3 is a schematic cross-sectional structure diagram of the flexible display panel shown in FIG. 2 in the AA' direction according to an embodiment of the present disclosure. FIG. 4 is a schematic cross-sectional structure diagram of the flexible display panel shown in FIG. 2 in the BB' direction according to an embodiment of the present disclosure. Since the connecting portion 105 has no flexible substrate, but the flexible bridging portion 104 has a flexible substrate, thus, when the preset region is stretched, the connecting portion 105 is more liable to be broken than the flexible bridging portion 104.

Figure 7:
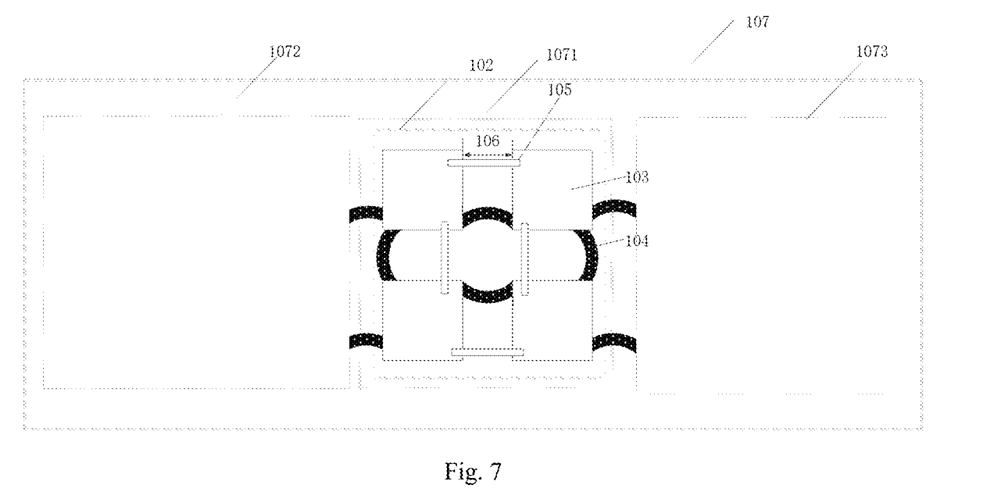
FIG. 7 is a schematic top view of another flexible display panel according to an embodiment of the present disclosure.

In practical application, in some special cases, the flexible display panel needs to be bent, for example, when the flexible display panel needs to cover two adjacent surfaces of an object, the flexible display panel needs to be bent; or, for example, when the flexible display panel that needs to be attached to a cylinder or other types of objects is arranged on the cylinder or other types of objects in some places, the flexible display panel also needs to be bent. Optionally, in the flexible display panel provided by the embodiment of the present disclosure, as shown in FIG. 7, the flexible display panel includes: a display region 107, and the display region 107 includes: a bending region 1071; and the bending region 1071 includes a preset region 102. In this way, when the flexible display panel needs to be bent, the flexible display panel can be bent through the bending region, thus, the flexible display panel can be bent, and the different usage requirements are met.

With the development of display technology, full screens have attracted widespread attention because of the large screen-to-body ratio and ultra-narrow frames, and thus the visual effect of the viewer is greatly improved compared with ordinary display screens. Generally, in order to increase the screen-to-body ratio of a display device (such as a mobile phone), the area of a lower frame can be reduced. In the solution for increasing the screen-to-body ratio specific to the lower frame area, a flexible display panel is usually adopted as the display panel, the portion, located at the position of the lower frame, of the flexible substrate of the flexible display panel is bent to the backlight side of a display region, and the width of the lower frame is reduced. In addition, the portion bent to the backlight side of the flexible display panel is bound to a driving chip. Optionally, in the flexible display panel provided by the embodiment of the present disclosure, as shown in FIG. 7, the display region 107 further includes a flat region located on at least one side of the bending region 1071. Exemplarily, the display region 107 may include two flat regions 1072 and 1073, where the flat region 1072 is located on one side of the bending region 1071, and the flat region 1073 is located on the other side of the bending region 1071. The display region may further include more flat regions, which can be designed and determined according to the actual application environment and is not limited here.

Optionally, in the flexible display panel provided by the embodiments of the present disclosure, a preset region may be used as the entire bending region for preparing the flexible display panel. Further, the bending region 1071 may also be used as the entire display region for preparing the flexible display panel.

Optionally, the connecting portion is a first strip structure, the flexible bridging portion is a second strip structure, and a width of the first strip structure is smaller than a width of the second strip structure. As shown in FIG. 4, at least one flexible bridging portion 104 is a second strip structure, of course, each flexible bridging portion 104 may be a second strip structure.

Optionally, referring to FIG. 2, the flexible display panel includes at least four display sub-regions 103;

in a horizontal direction, namely in the AA' direction, a flexible bridging portion 104 between two adjacent display sub-regions of the at least four display sub-regions is arranged near a center of the at least four display sub-regions, and a connecting portion 105 between the two adjacent display sub-regions of the at least four display sub-regions is arranged far away from the center of the at least four display sub-regions; and in a vertical direction, namely in the BB' direction, a flexible bridging portion 104 between two adjacent display sub-regions of the at least four display sub-regions is arranged far away from the center of the at least four display sub-regions, and a connecting portion 105 between the two adjacent display sub-regions of the at least four display sub-regions is arranged near the center of the at least four display sub-regions.

Figure 8:
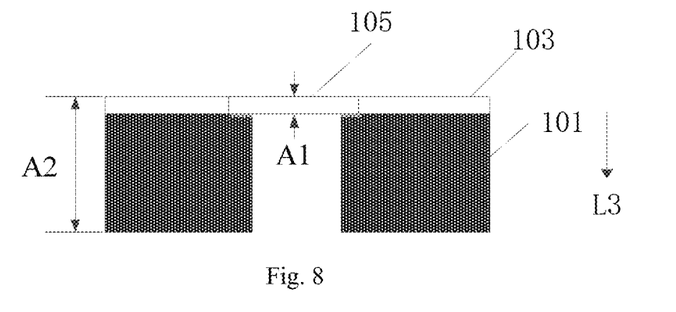
FIG. 8 is another schematic cross-sectional view of the flexible display panel shown in FIG. 2 in the AA' direction.

Optionally, in the flexible display panel provided by the embodiments of the present disclosure, as shown in FIG. 2 and FIG. 8, the connecting portion 105 has a first size A1 perpendicular to the direction L3 of the surface of the flexible substrate 101, and the flexible substrate 101 has a second size A2 in the direction L3 perpendicular to the surface of the flexible substrate, and the first size A1 is smaller than the second size A2. In this way, when the preset region is stretched, the connecting portions are more liable to be broken than the flexible substrate.

In specific implementation, A1<10 micron. For example, A1=7 microns, A1=5 micron or A1=3 micron. Certainly, in practical application, the specific value of A1 can be designed and determined according to the actual application environment, which is not limited here.

In specific implementation, 5 microns<A2<30 microns. For example, A2=9 microns, A2=15 microns or A2=27 micron. Certainly, in practical application, the specific value of A2 can be designed and determined according to the actual application environment, which is not limited here.

Exemplarily, one, two, three or more connecting portions 105 may be arranged between every two adjacent display sub-regions, which may be designed and determined according to an actual application environment and is not limited herein.

Optionally, in the flexible display panel provided by the embodiments of the present disclosure, as shown in FIG. 7, at least one connecting portion 105 is a first strip structure. Exemplarily, one, two, three or more connecting portions 105 are a first strip structure, and each connecting portion 105 may be a first strip structure, which can be designed and determined according to the actual application environment and is not limited here.

Figure 9:
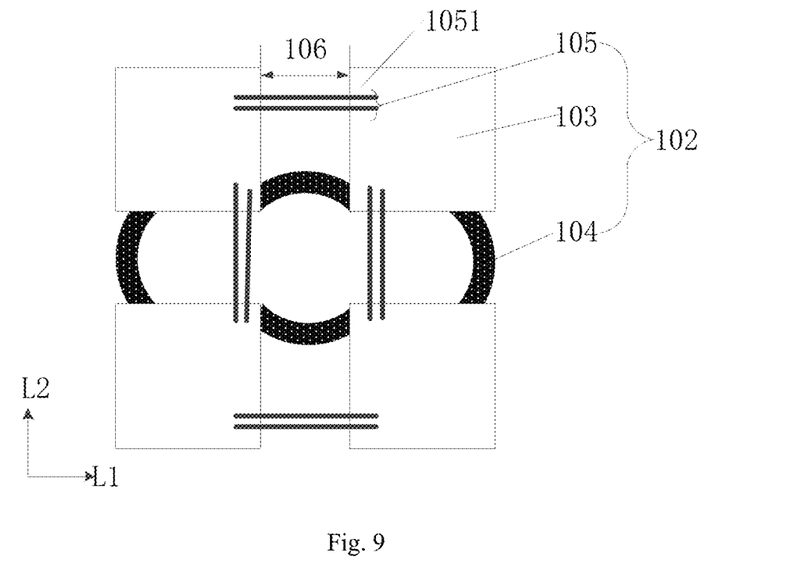
FIG. 9 is a schematic top view of another flexible display panel according to an embodiment of the present disclosure.

When the preset region 102 of the flexible display panel is stretched, in order to make the connecting portions 105 more easily break during stretching, the connecting portions 105 can be arranged as connecting lines 1051 as shown in FIG. 9, that is, at least one connecting portion 105 may include a plurality of mutually independent connecting lines 1051. Exemplarily, one, two, three or more connecting portions 105 are multiple independent connecting lines 1051, and each connecting portion 105 may also be multiple independent connecting lines 1051, which can be designed and determined based on actual application environment and is no limited here.

In order to make the connecting portions 105 more easily break during stretching, optionally, in the flexible display panel provided by the embodiment of the present disclosure, the connecting portions 105 may be doped with a brittle material. Exemplarily, the brittle material may include at least one of molybdenum or silicon oxide. Certainly, in practical application, the specific implementation of the brittle material can be set according to the actual application environment, which is not limited here.

Optionally, each of the plurality of display sub-regions includes a first flexible substrate, each of plurality of flexible bridging portions includes a second flexible substrate, and the first flexible substrate and the second flexible substrate are a continuous flexible substrate 101.

Optionally, each flexible bridging portion 104 may include a polyimide (PI) substrate, an inorganic insulating layer, an organic insulating layer and conductive wirings. Certainly, the flexible bridging portion 104 may further include an electroluminescent (EL) device. Each connecting portion 105 may include an inorganic insulating layer, certainly, in the other embodiment, the connecting portion 105 may further include a PI substrate, an organic insulating layer and conductive wirings.

Figure 10:
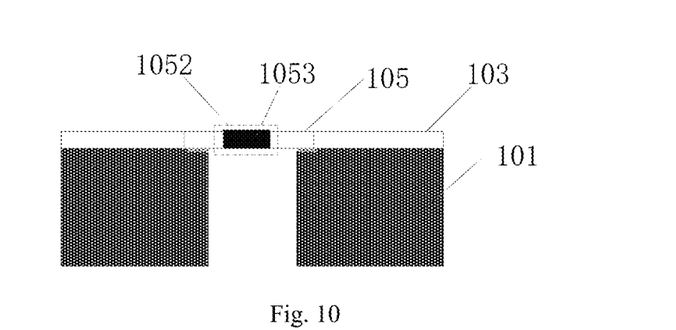
FIG. 10 is another schematic cross-sectional view of the flexible display panel shown in FIG. 2 in the AA' direction.

Optionally, in the flexible display panel provided by the embodiment of the present disclosure, as shown in FIG. 10, each connecting portion 105 is provided with a region 1052 in an opening 106 corresponding to every two adjacent display sub-regions 103, and the brittle material 1053 is distributed in the region 1052. By doping the regions 1052 of the connecting portions 105 with the brittle material 1053, when the preset region 102 of the flexible display panel is stretched, the connecting portions 105 are more likely to break due to the action of the brittle material, and then when the preset region 102 is deformed, the breaking risk of the flexible bridging portions 104 during stretching can be lowered.

Optionally, in a direction perpendicular to a surface of the continuous flexible substrate, an orthographic projection of the portion made of the brittle material in the each of the plurality of connecting portions on the continuous flexible substrate is not overlapped with an orthographic projection of two adjacent display sub-regions corresponding to the each of the plurality of connecting portions on the flexible substrate.

Since an organic light-emitting diode (OLED) flexible display panel has the advantages of low operating voltage, high response speed, high luminous efficiency, wide viewing angle, wide operating temperature range and the like, lightening and thinning, low power consumption and curved surfaces of display devices are facilitated. In addition, the OLED flexible display panel usually adopts driving circuits for driving the OLED to emit light. A driving circuit is generally and internally provided with a driving transistor for generating operating current for driving the OLED to emit light, a storage capacitor for stabilizing the voltage of a gate electrode of the driving transistor, a scan control transistor for controlling data signal input, and a light emitting control transistor for controlling the OLED to emit light. Certainly, the driving circuit further includes other transistors, and the structure of the driving circuit may be a structure in the prior art, and details are not described herein. The flexible display panel usually adopts data lines for transmitting data signals, gate lines for transmitting gate scan signals to scan control transistors so as to drive the scan control transistors to input data signals, and light emitting control signal lines for transmitting light emitting control signals to light emitting control transistors so as to drive the light emitting control transistors to control the OLED to emit light. In specific implementation, the flexible display panel provided by the embodiments of the present disclosure may be an organic light emitting flexible display panel.

Optionally, in the flexible display panel provided by the embodiments of the present disclosure, each display sub-region includes: a driving circuit and a light emitting element; where the light emitting element may be an OLED. Further, the flexible display panel further includes: a plurality of signal lines. The driving circuits and the light emitting elements may be arranged on the display sub-regions, the plurality of signal lines may be arranged on the flexible substrate, the signal lines are used for inputting signals to the driving circuits, the driving circuits control the light emitting elements to emit light according to the received signals, and thus the display sub-regions can display images. Exemplarily, the signal lines may be at least one of gate lines, data lines and light emitting control signal lines.

Optionally, in the flexible display panel provided by the embodiments of the present disclosure, the signal lines extend in the arrangement direction of the display sub-regions and each is in the flexible bridging portions between every two adjacent display sub-regions. When the preset region of the flexible display panel is stretched, the connecting portions are preferentially broken, then the preset region can be deformed, the breakage risk of the flexible bridging portions can be lowered, the breakage risk of the signal lines is further lowered, and therefore the display sub-regions can normally display.

Figure 11:
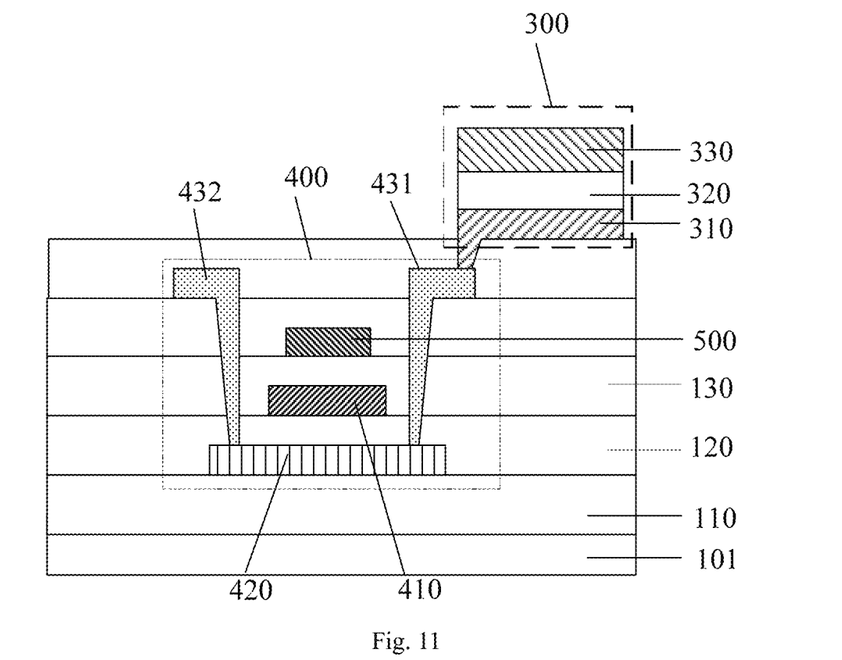
FIG. 11 is a schematic partial cross-sectional structural diagram of a flexible display panel according to an embodiment of the present disclosure.

Optionally, in the flexible display panel provided in the embodiments of the present disclosure, as shown in FIG. 11, each light emitting element 300 includes an anode electrode 310, an electroluminescent layer 320 and a cathode electrode 330 which are stacked, where one of the driving circuits is taken as an example for description, a thin film transistor 400 includes a gate electrode 410, an active layer 420 insulated from the gate electrode 410, a source electrode 431 and a drain electrode 432, and the source electrode 431 and the drain electrode 432 are insulated from the gate electrode 410 and electrically connected with the active layer 420; in addition, a metal electrode 500 insulated from both the source electrode 431 and the drain electrode 432 is arranged between the layer where the source electrode 431 and the drain electrode 432 of the transistor 400 are located and the layer where the gate electrode 410 is located; the orthographic projection of the metal electrode 500 on the flexible substrate 101 and the orthographic projection of the gate electrode 410 on the flexible substrate 101 have an overlapping region, and a storage capacitor is formed in the overlapping region; a buffer layer 110 is arranged between the active layer 420 and the flexible substrate 101, a gate insulating layer 120 is arranged between the gate electrode 410 and the active layer 420, and an interlayer dielectric layer 130 is arranged between the gate electrode 410 and the metal electrode 500. In practical application, the drain electrode 431 of each thin film transistor is electrically connected with the anode electrode 310 through a via hole, and is used for providing voltage to the anode electrode 310 so that the anode electrode 310 can inject holes into the electroluminescent layer 320, meanwhile, by loading voltage to the cathode electrode 330, the cathode electrode 330 inject electrons into the electroluminescent layer 320, and the holes and the electrons are recombined in the electroluminescent layer 320 to emit light, so that the display function of the flexible display panel is achieved.

Optionally, each of plurality of display sub-regions 103 includes a buffer layer 110, an active layer 420, a gate insulating layer 120, an interlayer dielectric layer 130, source and drain electrode layers (431, 432), an interlayer flat layer 140 and a thin film encapsulation (TFE) layer 160 which are arranged on the first flexible substrate. The TFE layer 160 includes a first TFE layer in each display sub-region 103, a second TFE layer in each flexible bridging portion 104 and a third TFE layer in each connecting portion 105.

Figure 12:
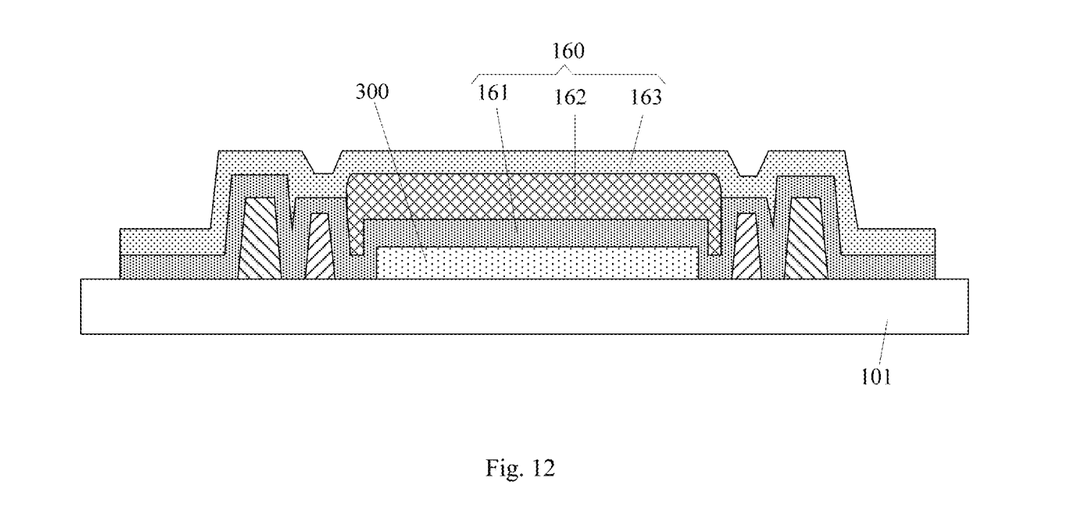
FIG. 12 is another schematic partial cross-sectional structure diagram of a flexible display panel according to an embodiment of the present disclosure.

In order to prevent the light emitting elements from being invaded by water and oxygen, in specific implementation, as shown in FIG. 12, a TFE layer 160 is further arranged on the side, away from the flexible substrate 101, of the light emitting elements 300. The TFE layer 160 may include: a first inorganic encapsulation layer 161, an organic encapsulation layer 162 and a second inorganic encapsulation layer 163 which are stacked. Through the TFE layer 160, water and oxygen can be prevented from invading.

Optionally, in the flexible display panel provided by the embodiments of the present disclosure, the connecting portion may be arranged on the same layer with the same material as at least one of the gate insulating layer, the interlayer dielectric layer and the buffer layer. In this way, an additional process for preparing the connecting portions is not needed, and the pattern of each connecting portion can be formed through only one patterning process, thus, the preparation process is simplified, the production cost is reduced, and the production efficiency is improved.

Optionally, in the flexible display panel provided by the embodiments of the present disclosure, the connecting portion may be arranged on the same layer with the same material as at least one of the first inorganic encapsulation layer 161 and the second inorganic encapsulation layer 163 of the thin film encapsulation layer. In this way, an additional process for preparing the connecting portions is not needed, and the pattern of each connecting portion can be formed through only one patterning process, thus, the preparation process is simplified, the production cost is reduced, and the production efficiency is improved.

Figure 13:
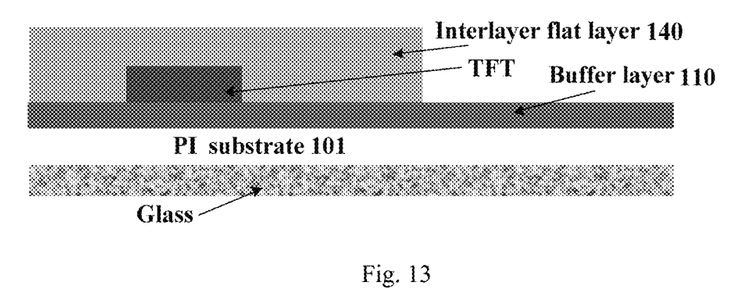
FIGS. 13-16 are schematic diagrams of a method for manufacturing the flexible display panel according to embodiments of the present disclosure.
Figure 14:
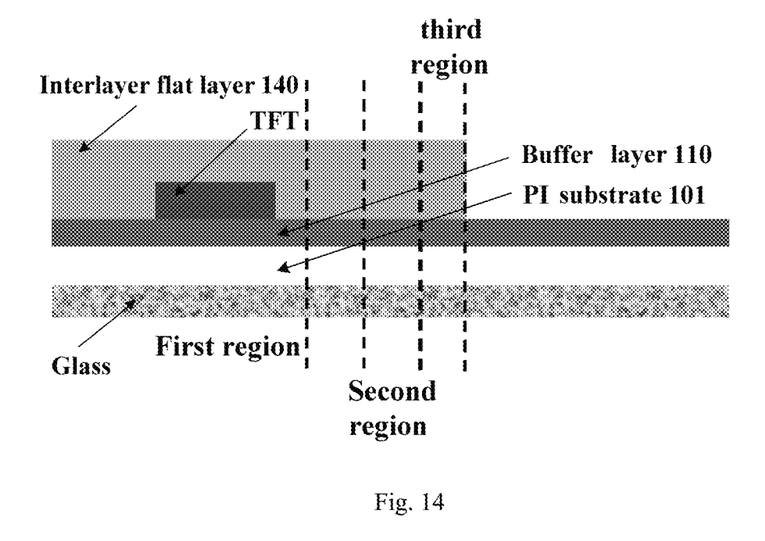

The embodiment of the present disclosure provides a method for manufacturing the above flexible display panel, as shown in FIGS. 13-16, the method specifically includes the following:

(1) Referring to FIG. 13, a buffer layer 110 is formed on a flexible substrate 101, for example, the buffer layer is an inorganic insulating layer. An interlayer flat layer 140 is formed on the buffer layer 110, for example, the interlayer flat layer is an organic insulating layer; exemplarily, the material of the interlayer flat layer 140 is photoactive material.

Figure 15:
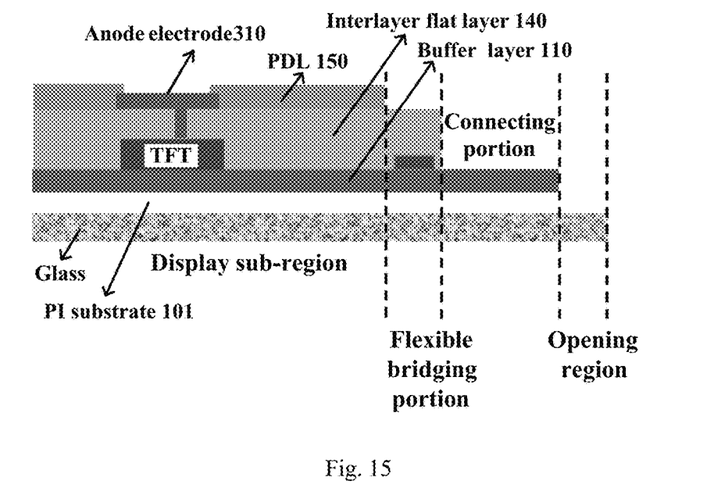

(2) The plurality of display sub-regions are formed by fabricating light emitting elements 300 on the interlayer flat layer 140 in first regions; where each light emitting element 300 may include an anode electrode 310, an electroluminescent layer 320, a cathode electrode 330 and a pixel define layer (PDL) 150. Referring to FIG. 15, an anode electrode 310 and a PDL 150 are formed on the interlayer flat layer 140 of the display sub-region.

(3) The plurality of connecting portions are formed by removing the interlayer flat layer 140 in second regions through exposure and development and by removing the flexible substrate 101 in the second regions through an etching process, such as a dry etching process. Where regions between the display sub-regions and the connecting portions correspond to the flexible bridging portions.

Optionally, the method for manufacturing the flexible display panel provided by the embodiment of the present disclosure further includes: an opening region is formed by removing the interlayer flat layer in a third region removed through exposure and development and by removing the buffer layer and the flexible substrate in the third region through the etching process. Exemplarily, the interlayer flat layer 140 of the connecting portion and the opening region can be removed through exposure and development simultaneously; and the flexible substrate 101 of the connecting portion and the opening region can be removed through etching process simultaneously. For example, the opening region forms the above opening 106.

Figure 16:
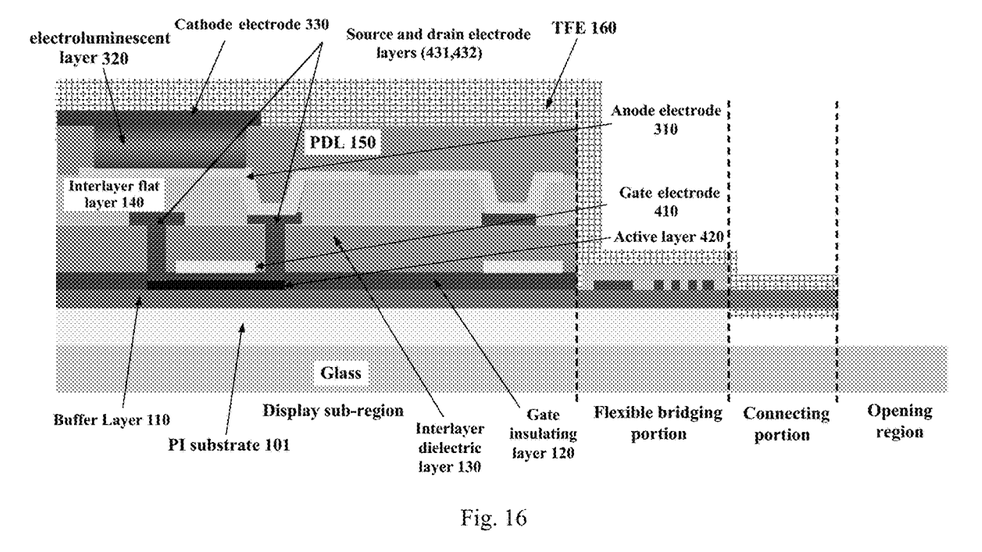

Optionally, referring to FIG. 16, the method for manufacturing the flexible display panel provided by the embodiment of the present disclosure further includes: a first TFE layer is formed on a side, away from the flexible substrate 101, of the light emitting element 300; a second TFE layer is formed on a side, away from the flexible substrate 101, of the interlayer flat layer 140 in the flexible bridging portion; and a third TFE layer is formed on a surface of the buffer layer 110 which is uncovered in the connecting portion.

Optionally, a thin film transistor is formed on the buffer layer 110 in the display sub-region, and the thin film transistor is a partial structure of a driving circuit.

In the method for manufacturing the flexible display panel, the connecting portion is arranged on a same layer with a same material as the buffer layer. Optionally, the flexible display panel provided by the embodiment of the present disclosure can be manufactured through another method; and in another method, the connecting portion can be arranged on a same layer with a same material as at least one of the gate insulating layer, the interlayer dielectric layer, and the thin film encapsulation layer.

Based on the same inventive concept, an embodiment of the present disclosure further provides a display device including the above-mentioned flexible display panel. The principle of the display device for solving the problem is similar to that of the aforementioned flexible display panel. Therefore, the implementation of the display device may refer to the implementation of the foregoing flexible display panel, and details are not repeated here.

In specific implementation, in the embodiments of the present disclosure, the display device may be any product or component with a display function, such as a mobile phone, a tablet computer, a television, a display, a notebook computer, a digital photo frame and a navigator. Other essential components of the display device are understood by those of ordinary skill in the art, which will not be repeated here and should not be used as a limitation on the present disclosure.

According to the flexible display panel and the display device provided by the embodiments of the present disclosure, the flexible display panel includes the flexible substrate and the preset region; the preset region includes: the plurality of display sub-regions arranged at intervals, the plurality of flexible bridging portions and the plurality of connecting portions; the opening is formed between every two adjacent display sub-regions, and every two adjacent display sub-regions are electrically connected through at least one flexible bridging portion; every two adjacent display sub-regions are further connected through at least one connecting portion; in the direction perpendicular to the extending direction of the openings and parallel to the surface of the flexible substrate, the size of the connecting portion is smaller than that of the flexible bridging portion; and the connecting portions are configured to enable the preset region on the flexible substrate to be stretched and to be deformed during breakage. Since the connecting portions and the flexible bridging portions which are connected between every two adjacent display sub-regions are independent of each other and are not connected with each other, and in the direction perpendicular to the extending direction of the openings and parallel to the surface of the flexible substrate, the size of the connecting portion is smaller than that of the flexible bridging portion, when the preset region of the flexible display panel is stretched, the connecting portions connected between every two adjacent display sub-regions are preferentially broken, and thus the preset region is deformed. Compared with the mode that a support structure is arranged between every two adjacent display sub-regions and the flexible display panel is deformed by controlling the support structures to break, in the present disclosure, by preferentially breaking the connecting portions, the preset region can be controlled to deform, and then the breakage risk of the flexible bridging portions during stretching can be lowered.

Obviously, those skilled in the art can make various modifications and variations to the present disclosure without departing from the spirit and scope of the present disclosure. In this way, if these modifications and variations of the present disclosure fall within the scope of the claims of the present disclosure and the equivalent technologies, the present disclosure also intends to include these modifications and variations.

What is claimed is:

1. A flexible display panel, wherein the flexible display panel comprises: a plurality of display sub-regions arranged at intervals, a plurality of flexible bridging portions and a plurality of connecting portions;

every two adjacent display sub-regions among the plurality of display sub-regions are electrically connected through at least one of the flexible bridging portions; and the every two adjacent display sub-regions are further electrically connected through at least one of the connecting portions;

wherein, in response to the every two adjacent display sub-regions being stretched, the at least one of the connecting portions is broken preferentially and then the every two adjacent display sub-regions deform; and the at least one of the flexible bridging portions is configured for electrically connecting the every two adjacent display sub-regions before the at least one of the connecting portions is broken and after the at least one of the connecting portion is broken;

wherein each of the plurality of display sub-regions comprises a first flexible substrate, and each of the plurality of flexible bridging portions comprises a second flexible substrate;

wherein the first flexible substrate and the second flexible substrate are a continuous flexible substrate;

wherein at least one of the connecting portions is a first strip structure, at least one of the flexible bridging portions is a second strip structure, and a width of the first strip structure is smaller than a width of the second strip structure.

2. The flexible display panel according to claim 1, wherein each of the plurality of connecting portions has a first size in a direction perpendicular to a surface of the continuous flexible substrate, the continuous flexible substrate has a second size in the direction perpendicular to the surface of the continuous flexible substrate, and the first size is smaller than the second size.

3. The flexible display panel according to claim 2, wherein the first size is smaller than 10 μm, and the second size is in a range of 5 μm~30 μm.

4. The flexible display panel according to claim 1, wherein each of the plurality of display sub-regions comprises a buffer layer, an active layer, a gate insulating layer, an interlayer dielectric layer, source and drain electrode layers, an interlayer flat layer and a thin film encapsulation layer which are arranged on the first flexible substrate; and
the thin film encapsulation layer comprises a first inorganic encapsulation layer, an organic encapsulation layer and a second inorganic encapsulation layer.

5. The flexible display panel according to claim 4, wherein the plurality of the connecting portions are arranged on a same layer with a same material as at least one of the gate insulating layer, the interlayer dielectric layer, the buffer layer and the first inorganic encapsulation layer and the second inorganic encapsulation layer.

6. The flexible display panel according to claim 1, wherein the flexible display panel comprises at least four display sub-regions;

in a horizontal direction, a flexible bridging portion between two adjacent display sub-regions of the at least four display sub-regions is arranged near a center of the at least four display sub-regions, and a connecting portion between the two adjacent display sub-regions of the at least four display sub-regions is arranged far away from the center of the at least four display sub-regions; and in a vertical direction, a flexible bridging portion between two adjacent display sub-regions of the at least four display sub-regions is arranged far away from the center of the at least four display sub-regions, and a connecting portion between the two adjacent display sub-regions of the at least four display sub-regions is arranged near the center of the at least four display sub-regions.

7. The flexible display panel according to claim 1, wherein at least one of the connecting portions comprises: a plurality of mutually independent connecting lines.

8. The flexible display panel according to claim 1, wherein each of the plurality of connecting portions comprises a portion made of a brittle material, and the brittle material comprises at least one of molybdenum or silicon oxide.

9. The flexible display panel according to claim 8, wherein in a direction perpendicular to a surface of the continuous flexible substrate, an orthographic projection of the portion made of the brittle material in the each of the plurality of connecting portions on the continuous flexible substrate is not overlapped with an orthographic projection of two adjacent display sub-regions corresponding to the each of the plurality of connecting portions on the continuous flexible substrate.

10. The flexible display panel according to claim 6, wherein the flexible display panel further comprises: a plurality of signal lines; and the plurality of signal lines extend in an arrangement direction of the at least four display sub-regions and each is in the at least one of the flexible bridging portions between the every two adjacent display sub-regions; and the signal lines are used for inputting signals to a driving circuit.

11. A display device, comprising the flexible display panel according to claim 1.

12. A method for manufacturing the flexible display panel according to claim 1, comprising:

forming a buffer layer on a flexible substrate;

forming an interlayer flat layer on the buffer layer;

forming the plurality of display sub-regions by fabricating light emitting elements on the interlayer flat layer in first regions; and forming the plurality of the connecting portions by removing the interlayer flat layer in second regions through exposure and development and by removing the flexible substrate in the second regions through an etching process;

wherein regions between the plurality of display sub-regions and the plurality of connecting portions correspond to the plurality of flexible bridging portions.

13. The method according to claim 12, further comprising:

forming an opening region by removing the interlayer flat layer in a third region through exposure and development and by removing the buffer layer and the flexible substrate in the third region through the etching process.

14. The method according to claim 12, further comprising:

forming a first thin film encapsulation layer on a side, away from the flexible substrate, of the light emitting elements;

forming a second thin film encapsulation layer on a side, away from the flexible substrate, of the interlayer flat layer in the plurality of flexible bridging portions; and forming a third thin film encapsulation layer on a surface of the buffer layer which is uncovered in the connecting portion.

* * * * *